US011127325B2

(12) United States Patent
Zhuang et al.

(10) Patent No.: US 11,127,325 B2
(45) Date of Patent: Sep. 21, 2021

(54) TECHNOLOGIES FOR ENABLING SIMPLIFIED PIXEL SHIFTING TO MITIGATE PIXEL BURN-IN

(71) Applicant: Intel Corporation, Santa Clara, CA (US)

(72) Inventors: Zhiming Zhuang, Sammamish, WA (US); Jun Jiang, Portland, OR (US); Arvind Kumar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 31 days.

(21) Appl. No.: 16/044,941

(22) Filed: Jul. 25, 2018

(65) Prior Publication Data

US 2019/0043399 A1 Feb. 7, 2019

(51) Int. Cl.
*G09G 3/00* (2006.01)
*H01L 27/32* (2006.01)
*G09G 3/3225* (2016.01)
*G06F 3/041* (2006.01)

(52) U.S. Cl.
CPC ............ *G09G 3/007* (2013.01); *H01L 27/323* (2013.01); *G06F 3/0412* (2013.01); *G09G 3/3225* (2013.01); *G09G 2320/048* (2013.01); *G09G 2340/0407* (2013.01)

(58) Field of Classification Search
CPC ........... G09G 3/007; G09G 2340/0407; G09G 2320/048; G09G 3/3225; H01L 27/323; G06F 3/0416; G06F 3/0412
See application file for complete search history.

(56) References Cited

U.S. PATENT DOCUMENTS

| 9,454,925 B1* | 9/2016 | Grafton ................ G09G 3/2007 |
| 2017/0068388 A1* | 3/2017 | Kim ........................ G06F 3/044 |
| 2017/0115821 A1* | 4/2017 | Chun .................... G06F 3/0418 |
| 2018/0286356 A1 | 10/2018 | Jiang et al. |

* cited by examiner

*Primary Examiner* — Amit Chatly
(74) *Attorney, Agent, or Firm* — Hanley, Flight & Zimmerman, LLC

(57) ABSTRACT

Technologies for performing a simplified pixel shifting scheme on a display (e.g., an organic light emitting diode (OLED) display) are disclosed herein. An electronic device presents, on the display, a virtual display having an active area and a margin area surrounding the active area. The active area is to display content (e.g., image data, video data, etc.), and an amount of pixels in the virtual display is greater than an amount of pixels in the active area. The electronic device is also to shift the pixels of the active area within the virtual display according to a pixel shifting technique and update a touch coordinate offset for the touch screen interface based on the shift.

37 Claims, 6 Drawing Sheets

TECHNOLOGIES FOR ENABLING SIMPLIFIED PIXEL SHIFTING TO MITIGATE PIXEL BURN-IN

BACKGROUND

Modern electronic displays, such as organic light emitting diode (OLED) displays provide digital displays in devices, such as in televisions, computer monitors, and mobile devices. However, such displays are susceptible to pixel burn-in resulting from degradation, in which each pixel loses luminance over time based on cumulative usage. Because each pixel may be used unevenly based on content being presented on the display, the rate of degradation may differ from pixel-to-pixel. Consequently, degradation causes undesirable effects on the display, such as non-uniform changes in luminance level. Current approaches to mitigating the effect of degradation to a display device includes compensation, in which different voltages are applied to a pixel to compensate for uneven usage relative to other pixels. However, compensation techniques can be complex and also may impede efficiency of the display device.

BRIEF DESCRIPTION OF THE DRAWINGS

The concepts described herein are illustrated by way of example and not by way of limitation in the accompanying figures. For simplicity and clarity of illustration, elements illustrated in the figures are not necessarily drawn to scale. Where considered appropriate, reference labels have been repeated among the figures to indicate corresponding or analogous elements.

DETAILED DESCRIPTION OF THE DRAWINGS

Figure 1:
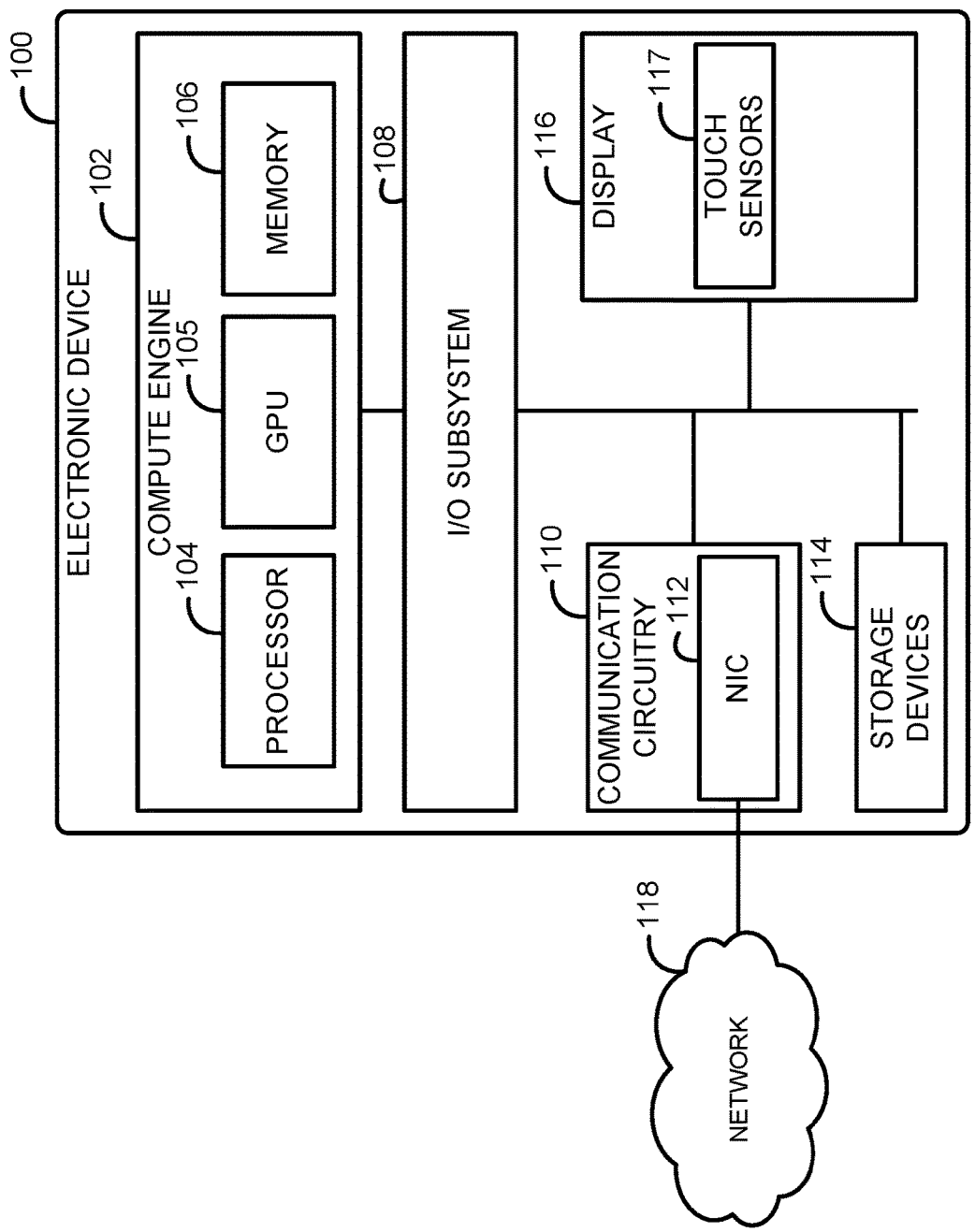
FIG. 1 is a simplified block diagram of at least one embodiment of an example electronic device configured to perform a simplified pixel shifting scheme using a virtual display.

Generally, pixel shifting is a technique used in displays, such as organic light emitting diode (OLED) displays of an electronic device, in which pixels are translated within the display in a given pattern to prevent degradation. For instance, a display driver may shift display content (e.g., image data, video data, and the like) down and to the right by a specified amount of pixels. However, one issue caused by such shifting is that a portion of the content will move out of an active area of the display, resulting in the portion of the content not being displayed and another portion of the active area being left blank. To address this, another approach for pixel shifting involves applying a shifting scheme to a portion of the content and also scaling towards a margin area of the display. However, such an approach adds complexity to pixel shifting because scaling ratios at different regions of the display may differ. For instance, in touch screen devices that use this approach, scaling content for pixel shifting may complicate synchronization between pixel shifted offsets and touch screen offsets. That is, as a pixel location changes due to shifting, touch screen drivers typically must identify the touch screen offset value based on the shifting and content scaling.

Embodiments presented herein disclose a virtual display used to mitigate the burn-in effect of pixels on a display, such as on an OLED display. The virtual display disclosed herein provides a dynamic active area that is used to display content data. The virtual display also provides a margin area of additional pixels that may be used by the active area in pixel shifting operations. More particularly, the active area matches an operating system-defined target pixel resolution for content display. For example, assume that the target resolution for content display corresponds to 1920×1080 pixels. In such a case, the active area may match the target resolution. Further, the margin area has a given amount of available pixels in which pixels from input content (e.g., displayed in the active area) may be shifted. Consequently, the virtual display provides a higher pixel resolution than that of the active area.

The virtual display may apply various pixel shifting operations. In some embodiments, a first pixel (also referred to herein as a starting point pixel) of the active area shifts one pixel step at a time according to a predefined shifting pattern. The active area moves uniformly along with the first pixel within the virtual display. Advantageously, by shifting the active area within the virtual display, content being displayed in the active area is not cropped from view. That is, the entirety of the content may be displayed via the virtual display. Further, because the active area of the virtual display matches a total number of pixels for an operating system-defined content resolution, embodiments presented herein eliminate the need to scale the content for pixel shifting operations. As a result, in cases in which the display is integrated with a touch screen interface of an electronic device, the offset at which pixels are shifted in the virtual display match an offset used for touch screen input, thus simplifying touch screen synchronization.

While the concepts of the present disclosure are susceptible to various modifications and alternative forms, specific embodiments thereof have been shown by way of example in the drawings and will be described herein in detail. It should be understood, however, that there is no intent to limit the concepts of the present disclosure to the particular forms disclosed, but on the contrary, the intention is to cover all modifications, equivalents, and alternatives consistent with the present disclosure and the appended claims.

References in the specification to "one embodiment," "an embodiment," "an illustrative embodiment," etc., indicate that the embodiment described may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C); (A and B); (A and C); (B and C); or (A, B, and C). Similarly, items listed in the form of "at least one of A, B, or C" can mean (A); (B); (C); (A and B); (A and C); (B and C); or (A, B, and C).

The disclosed embodiments may be implemented, in some cases, in hardware, firmware, software, or any combination thereof. The disclosed embodiments may also be implemented as instructions carried by or stored on a transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be shown in specific arrangements and/or orderings. However, it should be appreciated that such specific arrangements and/or orderings may not be required. Rather, in some embodiments, such features may be arranged in a different manner and/or order than shown in the illustrative figures. Additionally, the inclusion of a structural or method feature in a particular figure is not meant to imply that such feature is required in all embodiments and, in some embodiments, may not be included or may be combined with other features.

Referring now to FIG. 1, an electronic device 100 configured to perform simplified pixel shifting techniques using a virtual display is shown. The illustrative electronic device 100 can be a computing device such as a smartphone, laptop computer, desktop computer, tablet computer, and the like. The electronic device 100 may also be a display device such as a television or digital display.

As shown, the electronic device 100 includes a compute engine 102, an input/output (I/O) subsystem 108, communication circuitry 110, one or more storage devices 114, and a display 116. Of course, in other embodiments, the electronic device 100 may include other or additional components, such as those commonly found in a computer, such as peripheral devices. Additionally, in some embodiments, one or more of the illustrative components may be incorporated in, or otherwise form a portion of, another component.

The compute engine 102 may be embodied as any type of device or collection of devices capable of performing various compute functions described below. In some embodiments, the compute engine 102 may be embodied as a single device such as an integrated circuit, an embedded system, a field programmable gate array (FPGA), a system-on-a-chip (SOC), or other integrated system or device. Additionally, in some embodiments, the compute engine 102 includes or is embodied as a processor 104, a graphics processing unit (GPU) 105 and a memory 106. The processor 104 may be embodied as one or more processors, each processor being a type capable of performing the functions described herein. For example, the processor 104 may be embodied as a single or multi-core processor(s), a microcontroller, or other processor or processing/controlling circuit. In some embodiments, the processor 104 may be embodied as, include, or be coupled to an FPGA, an ASIC, reconfigurable hardware or hardware circuitry, or other specialized hardware to facilitate performance of the functions described herein. The GPU 105 may be embodied as any device or circuitry (e.g., a co-processor, reconfigurable circuitry, an ASIC, etc.) configured to process data for rendering on the display 116.

The memory 106 may be embodied as any type of volatile (e.g., dynamic random access memory, etc.) or non-volatile memory (e.g., byte addressable memory) or data storage capable of performing the functions described herein. Volatile memory may be a storage medium that requires power to maintain the state of data stored by the medium. Non-limiting examples of volatile memory may include various types of random access memory (RAM), such as DRAM or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4. Such standards (and similar standards) may be referred to as DDR-based standards and communication interfaces of the storage devices that implement such standards may be referred to as DDR-based interfaces.

In one embodiment, the memory device is a block addressable memory device, such as those based on NAND or NOR technologies. A memory device may also include a three dimensional crosspoint memory device (e.g., Intel 3D XPoint™ memory), or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product.

In some embodiments, 3D crosspoint memory (e.g., Intel 3D XPoint™ memory) may comprise a transistor-less stackable cross point architecture in which memory cells sit at the intersection of word lines and bit lines and are individually addressable and in which bit storage is based on a change in bulk resistance. In some embodiments, all or a portion of the memory 106 may be integrated into the processor 104.

The compute engine 102 is communicatively coupled with other components of the computing environment 100 via the I/O subsystem 108, which may be embodied as circuitry and/or components to facilitate input/output operations with the compute engine 102 (e.g., with the processor 104, the GPU 105, and/or the memory 106) and other components of the electronic device 100. For example, the I/O subsystem 108 may be embodied as, or otherwise include, memory controller hubs, input/output control hubs, integrated sensor hubs, firmware devices, communication links (e.g., point-to-point links, bus links, wires, cables, light guides, printed circuit board traces, etc.), and/or other components and subsystems to facilitate the input/output operations. In some embodiments, the I/O subsystem 108 may form a portion of a system-on-a-chip (SoC) and be incorporated, along with one or more of the processor 104, the memory 106, and other components of the electronic device 100, into the compute engine 102.

The communication circuitry 110 may be embodied as any communication circuit, device, or collection thereof, capable of enabling communications over a network 118 (e.g., the Internet) between the electronic device 100 and other devices. The communication circuitry 110 may be configured to use any one or more communication technology (e.g., wired or wireless communications) and associated protocols (e.g., Ethernet, Bluetooth®, Wi-Fi®, WiMAX, etc.) to effect such communication.

The illustrative communication circuitry 110 includes a network interface controller (NIC) 112, which may also be referred to as a host fabric interface (HFI). The NIC 112 may be embodied as one or more add-in-boards, daughtercards, controller chips, chipsets, or other devices that may be used by the electronic device 100 for network communications with remote devices. For example, the NIC 112 may be embodied as an expansion card coupled to the I/O subsystem 108 over an expansion bus such as PCI Express.

The one or more illustrative storage devices 114 may be embodied as any type of devices configured for short-term or long-term storage of data such as, for example, memory devices and circuits, memory cards, hard disk drives (HDDs), solid-state drives (SSDs), or other data storage devices. Each storage device 114 may include a system partition that stores data and firmware code for the storage device 114. Each storage device 114 may also include an operating system partition that stores data files and executables for an operating system.

The display 116 may be a built-in component of the electronic device 100 or externally coupled with the electronic device 100. In some embodiments, the display 116 is an OLED display. Of course, one of skill in the art will recognize that the embodiments disclosed herein may be adapted to other kinds of displays, such as plasma displays or various LED displays. Further, the display 116 may also be configured with one or a more touch sensors 117 used to detect and process touch screen input by a user.

As described above, the electronic device 100 is connected with a network 118, which may be embodied as any type of wired or wireless communication network, including global networks (e.g., the Internet), local area networks (LANs) or wide area networks (WANs), cellular networks (e.g., Global System for Mobile Communications (GSM), 3G, Long Term Evolution (LTE), Worldwide Interoperability for Microwave Access (WiMAX), etc.), digital subscriber line (DSL) networks, cable networks (e.g., coaxial networks, fiber networks, etc.), or any combination thereof.

Figure 2:
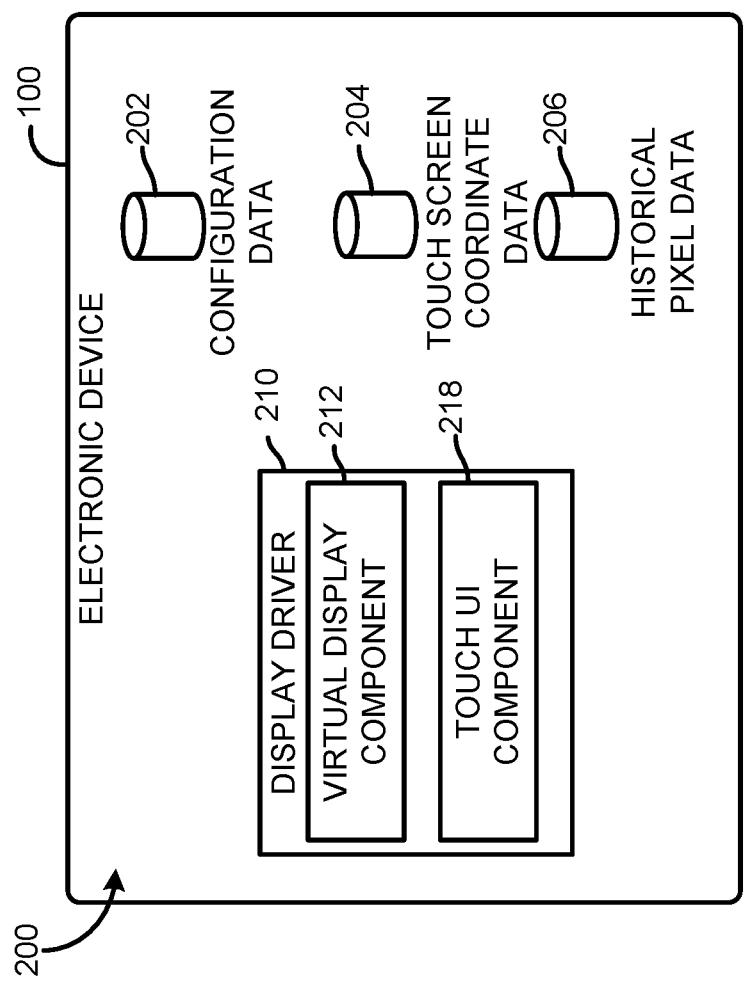
FIG. 2 is a simplified block diagram of at least one embodiment of an environment that may be established by the electronic device of FIG. 1.

Referring now to FIG. 2, the electronic device 100 may establish an environment 200 during operation. The illustrative environment 200 includes a display driver 210 having a virtual display component 212 and a touch user interface (UI) module 218. Each of the components of the environment 200 may be embodied as hardware, firmware, software, or a combination thereof. Further, although FIG. 2 depicts the virtual display component 212 and the touch user interface component 218 as being part of the display driver 210, the virtual display component 212 and touch UI component 218 may be separate components of the environment 200. Further still, in some embodiments, one or more of the components of the environment 200 may be embodied as circuitry or a collection of electrical devices (e.g., virtual display component circuitry 212, touch UI component circuitry 218, etc.). It should be appreciated that, in such embodiments, one or more of the virtual display component circuitry 212, and/or touch user interface component circuitry 218 may form a portion of one or more of the NIC 112, compute engine 102, the communication circuitry 110, the I/O subsystem 108, display 116, and/or other components of the electronic device 100.

In the illustrative embodiment, the environment 200 includes configuration data 202, which may be embodied as any data indicative of a configuration of pixel resolution format for a margin area and an active area of a virtual display rendered on the display 116. The configuration data 202 also includes specified pixel shifting settings that are indicative of a type of pixel shifting technique to use, such as whether to shift based on a predetermined pattern, whether to shift based on a historical pixel shifting analysis, and the like. Further, the environment 200 also includes touch screen coordinate data 204, which may be embodied as any data indicative of mappings and offsets between the virtual display and the touch UI. Particularly, the touch screen coordinate data 204 may include per-pixel offsets resulting from pixel shifting of the display content within the virtual display. The actual offsets may be predetermined for each pixel shifting technique (e.g., specified in the configuration data 202). These offsets may be used to synchronize the touch screen input to the display 116 with what is actually displayed and interacted with on the active area. Further still, the environment 200 also includes historical pixel data 206, which may be embodied as any data indicative of accumulated pixel usage on the electronic device 100. The historical pixel data 206 may be used to determine a history aware pixel shifting technique, e.g., in which a given pixel is assigned a time-weighted factor to each steps of a pixel shift such that certain pixel locations (that have less time weighting) are shifted less than others to minimize degradation.

The display driver 210, which may be embodied as hardware, firmware, software, virtualized hardware, emulated architecture, and/or a combination thereof, is to provide an interface between the display 116 and other components of the electronic device 100. In an embodiment, the display driver 210 renders a virtual display on the display 116 for presenting content data (e.g., image data, video data, and the like). To do so, the display driver 210 provides the virtual display component 212 and the touch UI component 218.

The virtual display component 212, which may be embodied as hardware, firmware, software, virtualized hardware, emulated architecture, and/or a combination thereof, is to generate and present a virtual display on the display 116. In some embodiments, the virtual display component 212 may determine a size of the virtual display elements based on a given pixel shifting scheme. For instance, assume that the configuration data 202 specifies that pixels are to be shifted by a maximum offset m_ps and n_ps for a M×N display (e.g., for a target content resolution of 2160×3840). The maximum offset may correspond to a predefined maximum pixel value at which a given pixel is offset when shifted according to a pixel shifting pattern. In some embodiments, the maximum offset may differ based on a given pixel shifting pattern that is applied to the virtual display. The virtual display component 212 may build a virtual display that has (M+m_ps)×(N+n_ps) pixels, in which M×N pixels are assigned to an active area of the virtual display and the rest of the pixels are assigned to the margin area to be used in performing a pixel shifting technique. To address (M+m_ps)×(N+n_ps) pixels, the virtual display component 212 selects a virtual pixel position as a first pixel and starting point for the active area. For instance, as a default, the starting point may be preset at a given location, such as (m_ps/2, n_ps/2), which is indicative of a middle location of the maximum offset on the x- and y-axis. As another example, the starting point of the active area may be (1, 1) or any point between (1, 1) and (m_ps, n_ps). Once selected, the virtual display component 212 may then fill the remaining registers of the active area with M*N data and assign a zero value (e.g., a black value) to the remaining pixels of the virtual display.

The virtual display component 212 may also perform a variety pixel shifting operations on the active area. For example, the virtual display component 212 may shift pixels of the entire active area according to a predetermined pixel shifting pattern and interval (e.g., as specified by the configuration data 202). Some patterns may include shifting the active area up by a given pixel offset, down by the offset, in a given direction (e.g., in a circular direction), and the like, for a specified period of time. Further, during a pixel shifting operation, for each shifting step, in which the active area is shifted through the virtual display by a pixel offset value, the virtual display component 212 recalculates the starting point of the active area based on the pixel offset value and fills the remaining registers. Advantageously, because the amount of pixels in the active area is equal to the amount of pixels in the input content, no scaling of the content in the active area is necessary.

Further, the touch sensors 117 may be synchronized across the virtual display, allowing the touch sensors 117 to detect touch screen input to over the range of (M+m_ps)× (N+n_ps). In some embodiments, the virtual display component 212 is configured to update coordinate offset information used by the touch sensors 117, in which the coordinate offset information corresponds to the pixel shifting technique performed within the virtual display. Doing so allows the touch sensors 117 to align with the shifted pixels. The virtual display component 212 may update the coordinate offset information in various ways. For example, the virtual display component 212 may transmit a hardware signal to a controller representative of a touch subsystem (not shown). Another example includes sending offset information through memory buffers between a display stack and touch kernels (not shown) executing on the GPU 105. Yet another example includes sending the information to a touch driver or a filter driver through inter process or driver communication. In some embodiments, the offset information may correspond to an x- and y-value by which the pixels are shifted from the top left corner of the active area of the virtual display. Further, the virtual display component 212 may filter touch data that corresponds to input outside of the active area (e.g., touch screen input detected at the margin area of the virtual display).

The touch UI component 218, which may be embodied as hardware, firmware, software, virtualized hardware, emulated architecture, and/or a combination thereof, is to process input from the touch sensors 117. The input may be coordinate data representative of an area on the display 116 at which the input was detected. The touch UI component 218 is further configured to receive offset information. For example, in embodiments in which offset information is stored in memory buffers between the display stack and touch kernels running on the GPU 105, the touch UI component 218 retrieves the offset information and translates the input prior to reporting the touch input coordinates to the operating system or applications, e.g., prior to an underlying operating system or application interpreting touch screen input. Doing so allows the touch UI component 218 to align touch screen input with pixel shifting operations being performed on the virtual display.

It should be appreciated that each of the display driver 210, virtual display component 212, and touch UI component 218 may be separately embodied as hardware, firmware, software, virtualized hardware, emulated architecture, and/or a combination thereof. For example, the virtual display component 212 may be embodied as hardware components, while the touch UI component 218 is embodied as virtualized hardware components or as some other combination of hardware, firmware, software, virtualized hardware, emulated architecture, and/or a combination thereof.

Figure 3A:
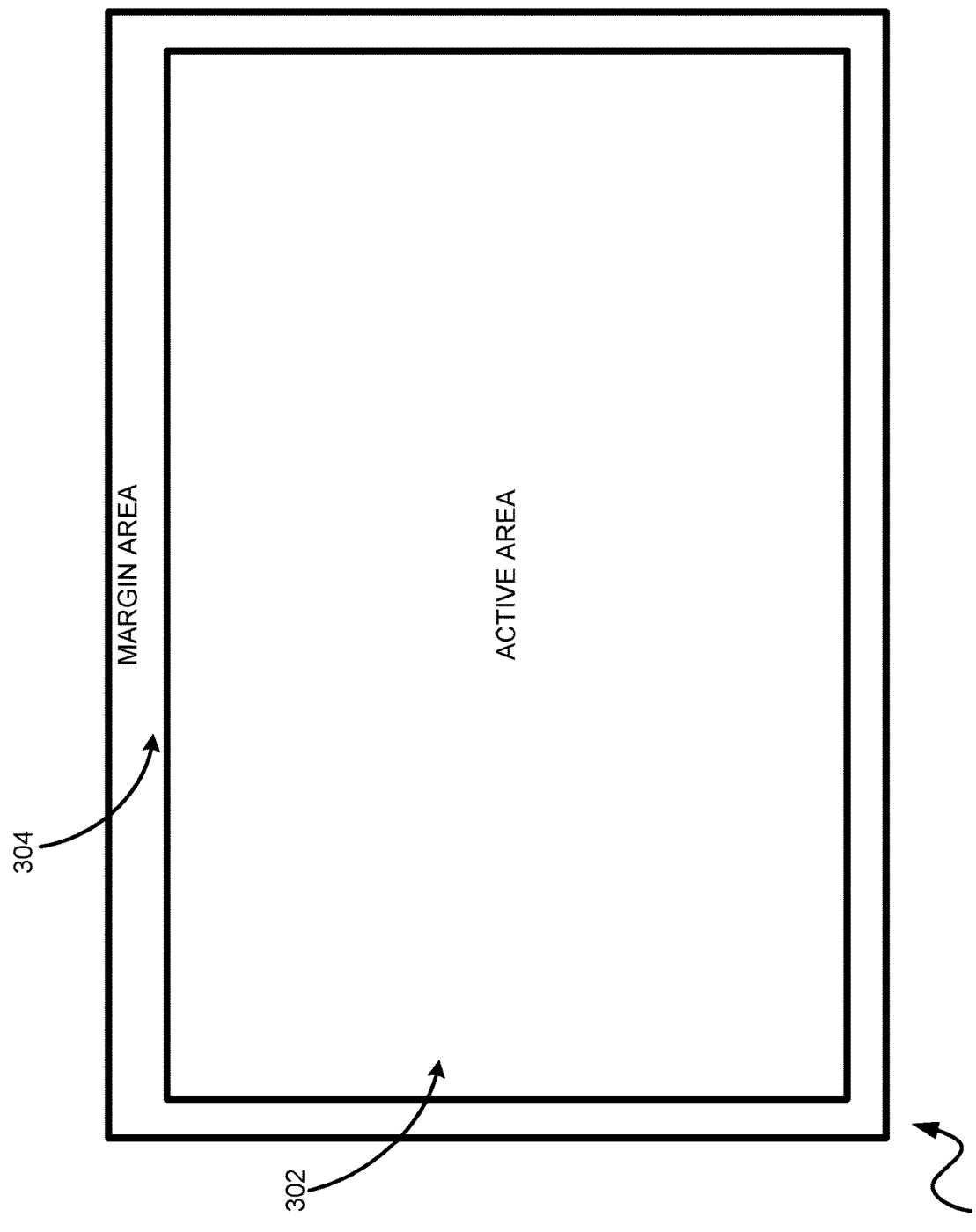
FIG. 3A is a simplified block diagram of at least one embodiment of a virtual display used for a simplified pixel shifting scheme on the electronic device of FIG. 1.

Referring now to FIG. 3A, a diagram depicting an example virtual display 300 is shown. Illustratively, the virtual display 300 includes an active area 302 and a margin area 304. The active area 302 matches a total number of pixels (or pixel format) of a desired operating system content resolution. The margin area 304 provides additional pixels used for pixel shifting operations, so as to prevent scaling and to avoid cropping of content to the display 116. For instance, to avoid cropping, the amount of pixels provided to the margin area 304 may be equal or greater than a maximum offset by which pixels are to be shifted from the active area 302.

Note, although FIG. 3A depicts the margin area 304 as occupying a considerable amount of pixels of the virtual display 300, this is done to clarify the embodiments disclosed herein. In practice, the margin area 304 may be occupy significantly fewer pixels and be unperceivable to an individual. Further, although the active area 302 is positioned relatively at the center of the virtual display 300, the active area 302 may be positioned at any area of the virtual display 300. For example, the active area 302 may be positioned on an upper left corner of the virtual display 300. In such a case, the margin area 304 would be positioned past the right and bottom edges of the active area 302. Further still, the active area 302 may be shifted as needed (e.g., as part of a given pixel shifting operation) to mitigate pixel burn-in. Consequently, the margin area 304 need not border the entire perimeter of the active area 302 and may be adjusted based on the pixel shifting technique being applied to the display. For example, the margin area 304 may partially border the active area 302 in the event that the active area 302 occupies the top left corner of the virtual display 300. In some embodiments, a placement of the margin area 304 may be determined based on a predetermined pixel shifting operation applied to the active area 302. For example, assume that the active area 302 is shifted towards the bottom right corner of the virtual display 300. In such a case, pixels for the margin area 304 may be allocated for the bottom and right portions of the virtual display 300.

Figure 3B:
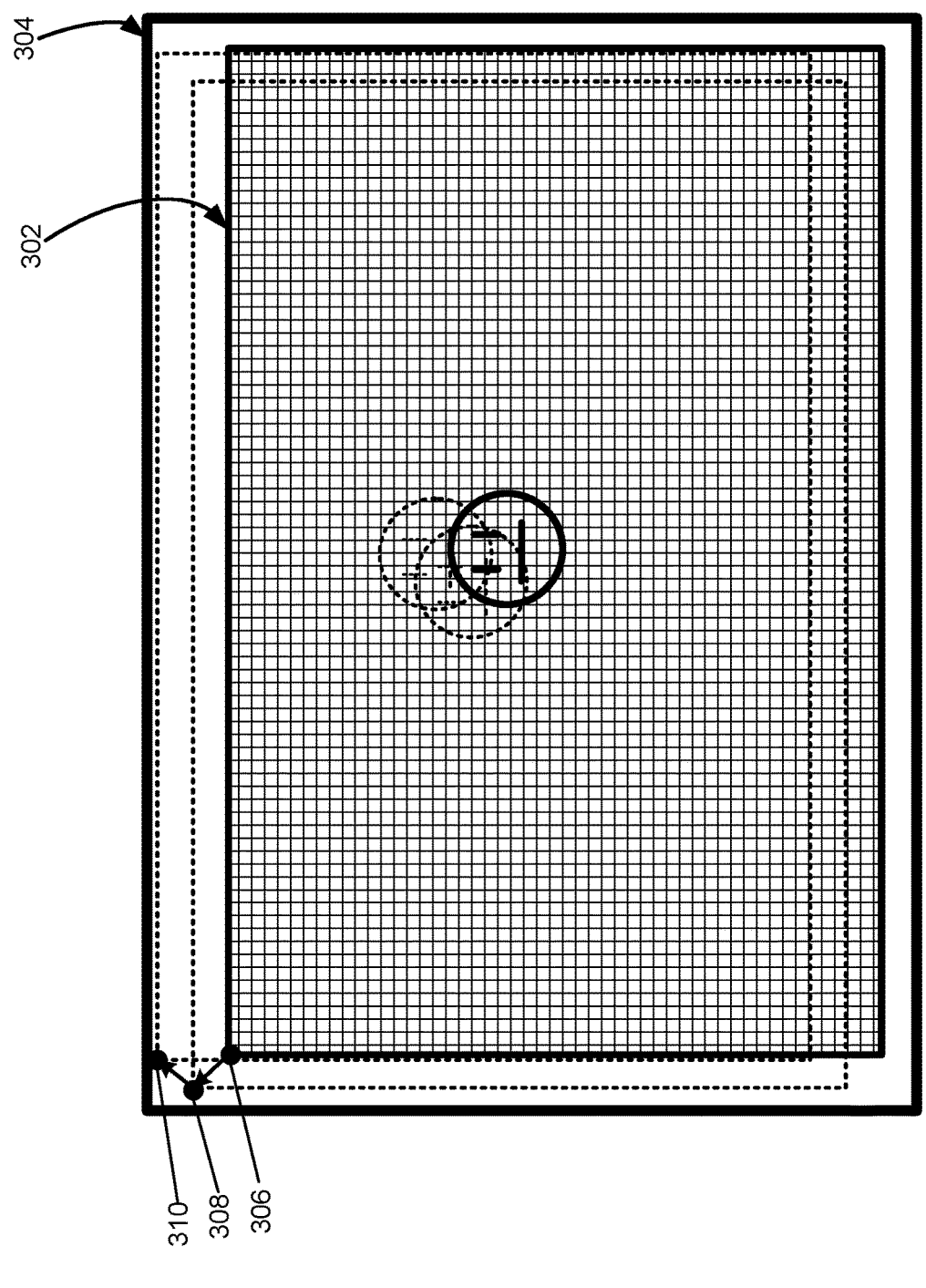
FIG. 3B is a conceptual diagram of at least one embodiment of pixel shifting display content within a virtual display.

Referring now to FIG. 3B, an example of pixel shifting content displayed within the active area 302 within the virtual display 300 is shown. Illustratively, the active area 302 presents an image for display. Further, the virtual display component 212 may drive pixel shifting operations on the active area 302. As stated, the pixel shifting operations may be based on predetermined shifting patterns (e.g., according to the configuration data 202). In this example, the active area (and content displayed therein) is shifted in a diagonal pattern upwards, as shown by the position of a depiction of the top left pixel in 306, 308, and 310.

In moving from position 306 to position 308 (and from position 308 to position 310), the starting point of the active area is recalculated, saved, and used to fill address registers. Since the active area equals the size of the content resolution, no scaling is necessary. Further, because no scaling is needed in the margin area 304, mapping of touch screen input is simplified. For instance, in this example, the coordinate offset is saved for the touch UI component 218 at each shift step. The coordinate offset that is saved corresponds to the pixel position of the top left pixel (e.g., at positions 306, 306, 310). When the touch UI component 218 receives touch input (e.g., from a user) corresponding to a coordinate position, the touch UI component 218 may retrieve the coordinate offset and apply the coordinate offset to the touch input coordinates.

Figure 4:
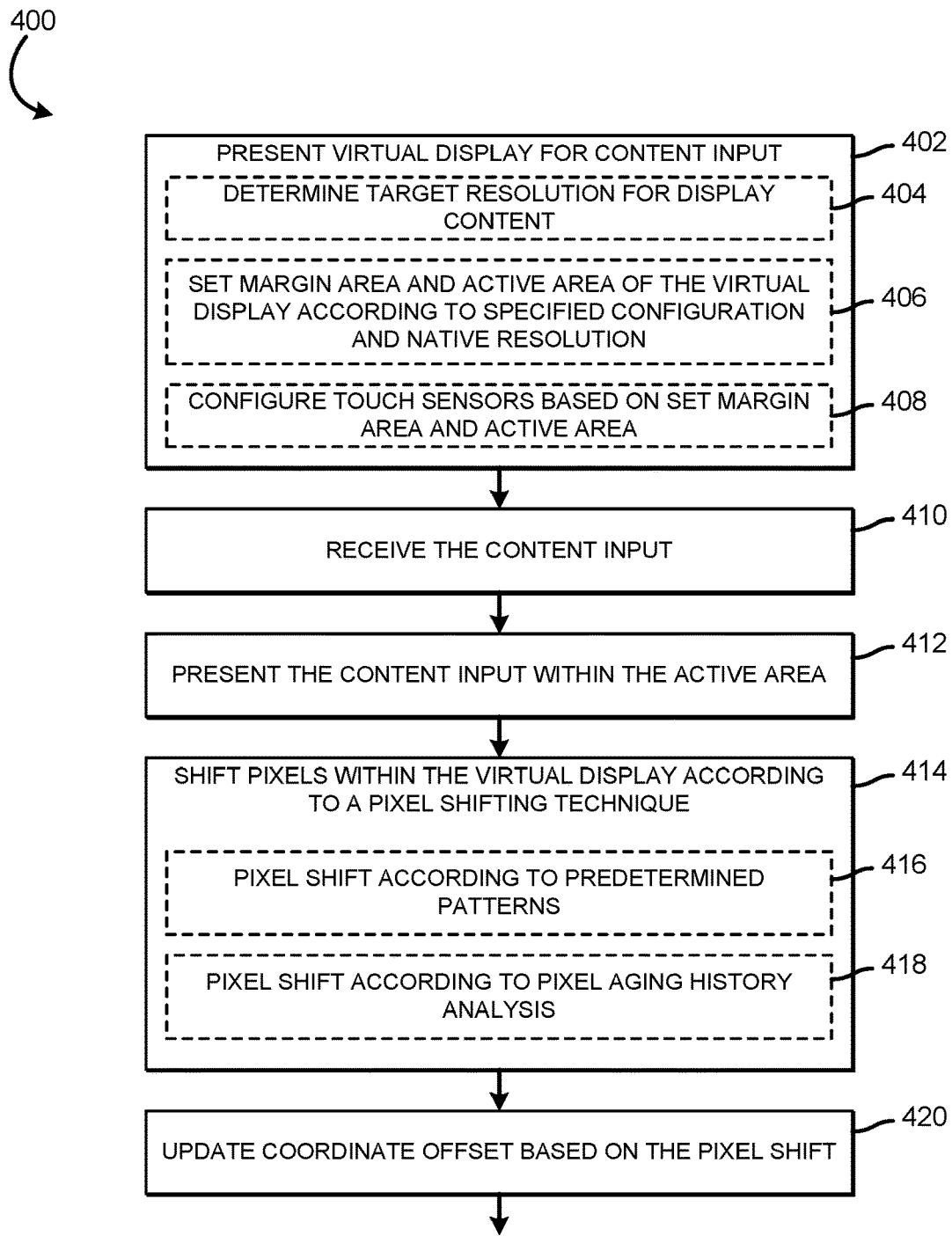
FIG. 4 is a simplified flow diagram of at least one embodiment of a method for performing a simplified pixel shifting scheme using a virtual display that may be performed by the electronic device of FIG. 1.

Referring now to FIG. 4, the electronic device 100, in operation, performs a method 400 for performing a simplified pixel shifting scheme using a virtual display (e.g., the virtual display 300). The method 400 may be performed, e.g., by the display driver 210 or by components incorporated on the hardware of the electronic device 100 (e.g., a SoC).

As shown, the method 400 begins in block 402, in which the electronic device 100 presents the virtual display for content. For instance, to do so, in block 404, the electronic device 100 determines (e.g., from configuration data 202) a target pixel resolution for display content. For example, the configuration data 202 may indicate that the target resolution is 2160×3840 pixels. Once determined, in block 406, the electronic device 100 sets the margin area and the active area of the virtual display according to the determined display resolution and further configuration data 202 for the virtual display. For instance, the electronic device 100 may, based on the configuration data 202, build a virtual display that has the content resolution (e.g., active area resolution) of 2160×3840 with an amount of pixels to set aside for the margin area, e.g., such that the virtual display resolution is (2160+20)×(3840+20) pixels. The electronic device 100 may then render the virtual display on the display 116. In block 408, the electronic device 100 configures touch sensors based on the set margin area and active area. The electronic device 100 may do so by communicating coordinate information of the top left pixel of the active area to a touch interface (e.g., to a touch interface driver, filter driver, etc.). Continuing the previous example of the virtual display having a resolution of (2160+20)×(3840+20) pixels, the electronic device 100 may transmit the coordinate information corresponding to the top left corner pixel of the active area to the touch interface.

In block 410, the electronic device 100 receives the input content. In block 412, the electronic device 100 renders and displays the content within the active area of the virtual display. Further, in block 414, the electronic device shifts pixels within the virtual display according to a pixel shifting technique. The pixel shifting technique may be specified in the configuration data 202. For example, in block 416, the electronic device 100 may perform a pixel shifting operation that translates the content and the active area across the virtual display according to predetermined patterns. The patterns are indicative of a predetermined path within the virtual display such that the entirety of the displayed content is still presented on the display. As another example, in block 418, the electronic device 100 performs a pixel shifting operation according to a pixel aging history analysis. In particular, the electronic device 100 tracks (e.g., via the GPU 105) historical data for content that has been displayed. The electronic device 100 may analyze the tracked historical data to generate or update priority levels for pixels based on the amount of usage in the areas of the display. Based on the priority levels and time weighting on each of the areas, the electronic device 100 may shift pixels in those areas more or less to further reduce burn-in.

In block 420, the electronic device 100 updates coordinate offsets based on the pixel shift. To do so, the electronic device 100 can measure a coordinate offset, such as the top left pixel of the active area of the virtual display, and transmit the offset information to the touch interface of the electronic device, e.g., to a touch driver or a memory buffer used by the touch interface. As a result, the touch interface may apply the offset prior to registering touch screen input in an application executing on the electronic device 100 that uses touch sensors.

Figure 5:
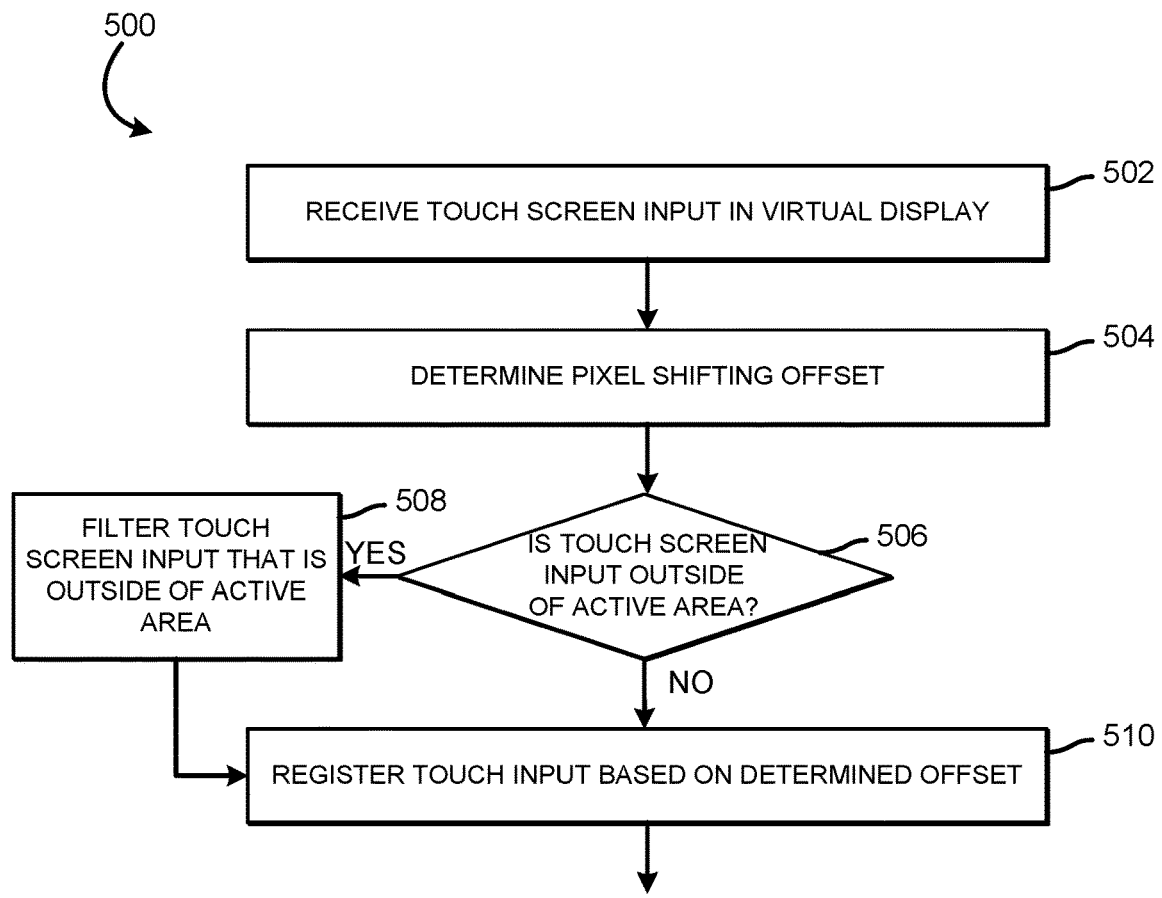
FIG. 5 is a simplified flow diagram of at least one embodiment of a method for processing touch screen input in a virtual display used for performing a simplified pixel shifting scheme that may be performed by the electronic device of FIG. 1.

Referring now to FIG. 5, the electronic device 100, in operation, performs a method 500 for processing touch screen input (also referred to herein as "touch sensor input") synchronized with the virtual display. Generally, the touch screen data is offset based on the pixel shift before the touch interface reports the touch coordinates to the operating system of the electronic device 100.

As shown, the method 500 begins in block 502, in which the electronic device 100 receives touch screen input in the virtual display. In block 504, the electronic device 100 determines a coordinate offset resulting from a pixel shifting operation. To do so, the electronic device 100 may retrieve coordinate offset information from a memory buffer storing such information during the performance of the pixel shifting. For example, assume that the real pixel value of the top left corner of the active area is (10, 20). The electronic device 100 may thereafter apply the pixel shifting offset to determine a location of the touch input relative to the virtual display. In particular, the electronic device 100 may add or subtract the pixel shifting offset from the raw value. Continuing the previous example, because the top left corner is always reported to the operating system as (0, 0), the electronic device 100 subtracts the (10, 20) values from the raw value to return (0, 0).

In block 506, the electronic device 100 determines whether any of the touch screen input is outside of the active area. If so, then in block 508, the electronic device 100 filters out touch screen input that is outside of the active area. That is, the touch driver does not register the touch screen input corresponding to input outside of the active area with the operating system. The filtered input may correspond to a portion of the touch screen input that is detected in the active area. Following the filtering (or if the entirety of the touch screen input is within the active area), then in block 510, the electronic device reports the touch input based on the determined pixel shifting offset with the operating system.

EXAMPLES

Illustrative examples of the technologies disclosed herein are provided below. An embodiment of the technologies may include any one or more, and any combination of, the examples described below.

Example 1 includes an electronic device comprising a display comprising a plurality of pixels and a touch screen interface; and a compute engine to present, on the display, a virtual display having an active area and a margin area at least partially bordering the active area, wherein the active area is to display content and wherein an amount of the pixels in the virtual display is greater than an amount of pixels in the active area; and shift the pixels of the active area within the virtual display according to a pixel shifting technique.

Example 2 includes the subject matter of Example 1, and wherein the compute engine is further to update a touch coordinate offset for the touch screen interface based on the shift.

Example 3 includes the subject matter of any of Examples 1 and 2, and wherein the compute engine is further to receive touch sensor input to the touch screen interface; and register the touch sensor input on the electronic device based on the updated touch coordinate offset.

Example 4 includes the subject matter of any of Examples 1-3, and wherein the compute engine is further to receive touch sensor input to the touch screen interface; and determine that a portion of the touch sensor input is in the margin area.

Example 5 includes the subject matter of any of Examples 1-4, and wherein the compute engine is further to remove the portion of the touch sensor input that is in the margin area; and send a remaining portion of the touch sensor input to the touch screen interface.

Example 6 includes the subject matter of any of Examples 1-5, and wherein to shift the pixels of the active area within the virtual display comprises to shift the pixels of the active area according to one or more predetermined shifting patterns.

Example 7 includes the subject matter of any of Examples 1-6, and wherein to shift the pixels of the active area within the virtual display comprises to shift the pixels of the active area according to a pixel aging history analysis.

Example 8 includes the subject matter of any of Examples 1-7, and wherein to present the virtual display comprises to determine a target resolution for the content; and set the margin area and the active area according to the target resolution, wherein a resolution of the active area matches the target resolution.

Example 9 includes the subject matter of any of Examples 1-8, and wherein the electronic device further comprises a plurality of touch sensors coupled with the touch screen interface and wherein to present the virtual display further comprises to configure each of the touch sensors based on the set margin area and active area.

Example 10 includes the subject matter of any of Examples 1-9, and wherein the display is an organic light-emitting diode (OLED) display.

Example 11 includes one or more machine-readable storage media storing a plurality of instructions, which, when executed on an electronic device, causes the electronic device to present, on the display, a virtual display having an active area and a margin area at least partially bordering the active area, wherein the active area is to display content and wherein an amount of the pixels in the virtual display is greater than an amount of pixels in the active area; and shift the pixels of the active area within the virtual display according to a pixel shifting technique.

Example 12 includes the subject matter of Example 11, and wherein the plurality of instructions further causes the electronic device to update a touch coordinate offset for the touch screen interface based on the shift.

Example 13 includes the subject matter of any of Examples 11 and 12, and wherein the plurality of instructions further causes the electronic device to receive touch sensor input to the touch screen interface; and register the touch sensor input on the electronic device based on the updated touch coordinate offset.

Example 14 includes the subject matter of any of Examples 11-13, and wherein the plurality of instructions further causes the electronic device to receive touch sensor input to the touch screen interface; and determine that a portion of the touch sensor input is in the margin area.

Example 15 includes the subject matter of any of Examples 11-14, and wherein the plurality of instructions further causes the electronic device to remove the portion of the touch sensor input that is in the margin area; and send a remaining portion of the touch sensor input to the touch screen interface.

Example 16 includes the subject matter of any of Examples 11-15, and wherein to shift the pixels of the active area within the virtual display comprises to shift the pixels of the active area according to one or more predetermined shifting patterns.

Example 17 includes the subject matter of any of Examples 11-16, and wherein to shift the pixels of the display within the virtual display comprises to shift the pixels of the active area according to a pixel aging history analysis.

Example 18 includes the subject matter of any of Examples 11-17, and wherein to present the virtual display comprises to determine a target resolution for the content; and set the margin area and the active area according to the target resolution, wherein a resolution of the active area matches the target resolution.

Example 19 includes the subject matter of any of Examples 11-18, and wherein the electronic device further comprises a plurality of touch sensors coupled with the touch screen interface and wherein to present the virtual display further comprises to configure each of the touch sensors based on the set margin area and active area.

Example 20 includes the subject matter of any of Examples 11-19, and wherein the display is an organic light-emitting diode (OLED) display.

Example 21 includes a method, comprising presenting, on a display having a plurality of pixels and a touch screen interface, a virtual display having an active area and a margin area at least partially bordering the active area, wherein the active area is to display content and wherein an amount of the pixels in the virtual display is greater than an amount of pixels in the active area; and shifting the pixels of the active area within the virtual display according to a pixel shifting technique.

Example 22 includes the subject matter of Example 21, and further including updating a touch coordinate offset for the touch screen interface based on the shift.

Example 23 includes the subject matter of any of Examples 21 and 22, and further including receiving input to the touch screen interface; and reporting the input on the electronic device based on the updated touch coordinate offset.

Example 24 includes the subject matter of any of Examples 21-23, and further including receiving input to the touch screen interface; and determining that a portion of the input is in the margin area.

Example 25 includes an electronic device comprising a display having a plurality of pixels and a touch screen interface; circuitry for presenting, on the display, a virtual display having an active area and a margin area at least partially bordering the active area, wherein the active area is to display content and wherein an amount of the pixels in the virtual display is greater than an amount of pixels in the active area; and means for shifting the pixels of the active area within the virtual display according to a pixel shifting technique.

The invention claimed is:
1. An electronic device comprising:
a display including a plurality of pixels and a touch screen interface; and
a compute engine to:
identify a first pixel of the plurality of pixels as a starting point for an active area of a virtual display, the active area corresponding to a first subset of the pixels defined relative to the starting point based on consistent dimensions of the active area, the consistent dimensions matching a fixed pixel width and a fixed pixel height, the virtual display having a margin area corresponding to a second subset of the pixels of the display different than the first subset, the margin area at least partially bordering the active area, particular ones of the plurality of pixels included in the first subset to change as a location of the active area moves relative to the plurality of pixels based on movement of the starting point relative to the plurality of pixels, the active area to maintain the consistent dimensions as the starting point moves;

cause the display to present visual content within the virtual display, the visual content limited to the active area; and shift the starting point to a second pixel different than the first pixel according to a pixel shifting technique, the shift of the starting point to uniformly move the active area relative to the plurality of pixels.

2. The electronic device of claim 1, wherein the compute engine is to:
update a touch coordinate offset for the touch screen interface based on the shift of the starting point.

3. The electronic device of claim 2, wherein the compute engine is to:
obtain touch sensor input to the touch screen interface; and
register the touch sensor input on the electronic device based on the updated touch coordinate offset.

4. The electronic device of claim 2, wherein the compute engine is to:
obtain touch sensor input to the touch screen interface; and
determine that a portion of the touch sensor input is in the margin area.

5. The electronic device of claim 4, wherein the compute engine is to:
remove the portion of the touch sensor input that is in the margin area; and
send a remaining portion of the touch sensor input to the touch screen interface.

6. The electronic device of claim 1, wherein the pixel shifting technique defines one or more shifting patterns to be followed by the active area as the starting point shifts.

7. The electronic device of claim 1, wherein the pixel shifting technique includes a pixel aging history analysis.

8. The electronic device of claim 1, wherein the compute engine is to:
determine a target resolution for the visual content, the target resolution corresponding to the fixed pixel width and the fixed pixel height; and
set the margin area and the active area according to the target resolution.

9. The electronic device of claim 8, further including a plurality of touch sensors coupled with the touch screen interface, the compute engine to:
configure each of the touch sensors based on the set margin area and the set active area.

10. The electronic device of claim 1, wherein the display is an organic light-emitting diode (OLED) display.

11. One or more machine-readable storage media comprising instructions, which, when executed on an electronic device having a display including a plurality of pixels and a touch screen interface, cause the electronic device to:

identify a first pixel of the plurality of pixels as a starting point for an active area of a virtual display, the active area corresponding to a first set of the pixels defined relative to the starting point based on consistent dimensions of the active area, the consistent dimensions matching a fixed pixel width and a fixed pixel height, the virtual display having a margin area corresponding to a second set of the pixels of the display different than the first set, the margin area at least partially bordering the active area, particular ones of the plurality of pixels included in the first set to change as a location of the active area moves relative to the plurality of pixels based on movement of the starting point relative to the plurality of pixels, the active area to maintain the consistent dimensions as the active area moves;

cause the display to present visual content within the virtual display, the visual content to be limited to the active area; and shift the starting point to a second pixel different than the first pixel according to a pixel shifting technique, the shift of the starting point to uniformly move the active area relative to the plurality of pixels.

12. The one or more machine-readable storage media of claim 11, wherein the instructions further cause the electronic device to:
update a touch coordinate offset for the touch screen interface based on the shift of the starting point.

13. The one or more machine-readable storage media of claim 12, wherein the instructions further cause the electronic device to:
obtain touch sensor input to the touch screen interface; and
register the touch sensor input on the electronic device based on the updated touch coordinate offset.

14. The one or more machine-readable storage media of claim 12, wherein the instructions further cause the electronic device to:
obtain touch sensor input to the touch screen interface; and
determine that a portion of the touch sensor input is in the margin area.

15. The one or more machine-readable storage media of claim 14, wherein the instructions further cause the electronic device to:
remove the portion of the touch sensor input that is in the margin area; and
send a remaining portion of the touch sensor input to the touch screen interface.

16. The one or more machine-readable storage media of claim 11, wherein the pixel shifting technique defines one or more shifting patterns to be followed by the active area as the starting point shifts.

17. The one or more machine-readable storage media of claim 11, wherein the pixel shifting technique includes a pixel aging history analysis.

18. The one or more machine-readable storage media of claim 11, wherein the instructions further cause the electronic device to:
determine a target resolution for the visual content, the target resolution corresponding to the fixed pixel width and the fixed pixel height; and
set the margin area and the active area according to the target resolution.

19. The one or more machine-readable storage media of claim 18, wherein the electronic device includes a plurality of touch sensors coupled with the touch screen interface and the instructions further cause the electronic device to:

configure each of the touch sensors based on the set margin area and the set active area.

20. The one or more machine-readable storage media of claim 11, wherein the display is an organic light-emitting diode (OLED) display.

21. A method for operating an electronic device having a display including a plurality of pixels and a touch screen interface, the method comprising:
identifying a first pixel of the plurality of pixels as a starting point for an active area of a virtual display, the active area corresponding to a first subset of the pixels defined relative to the starting point based on consistent dimensions of the active area, the consistent dimensions matching a fixed pixel width and a fixed pixel height, the virtual display having a margin area corresponding to a second subset of the pixels of the display different than the first subset, the margin area at least partially bordering the active area, particular ones of the plurality of pixels included in the first subset to change as a location of the active area moves relative to the plurality of pixels based on movement of the starting point relative to the plurality of pixels, the active area to maintain the consistent dimensions as the starting point moves;
causing the display to present visual content within the active area of the virtual display, the visual content having a size corresponding to the active area; and
shifting the starting point to a second pixel different than the first pixel according to a pixel shifting technique, the shift of the starting point to uniformly move the active area relative to the plurality of pixels.

22. The method of claim 21, further including:
updating a touch coordinate offset for the touch screen interface based on the shift of the starting point.

23. The method of claim 22, further including:
receiving input to the touch screen interface; and
reporting the input based on the updated touch coordinate offset.

24. The method of claim 22, further including:
receiving input to the touch screen interface; and
determining that a portion of the input is in the margin area.

25. An electronic device comprising:
a display having a plurality of pixels and a touch screen interface; and
means for executing instructions, the executing means to:
identify a first pixel of the plurality of pixels as a starting point for an active area of a virtual display, the active area corresponding to a first subset of the pixels defined relative to the starting point based on consistent dimensions of the active area, the consistent dimensions matching a fixed pixel width and a fixed pixel height, the virtual display having a margin area corresponding to a second subset of the pixels of the display different than the first subset, the margin area at least partially bordering the active area, particular ones of the plurality of pixels included in the first subset to change as a location of the active area moves relative to the plurality of pixels based on movement of the starting point relative to the plurality of pixels, the active area to maintain the consistent dimensions as the starting point moves;
cause the display to present visual content within the virtual display, the visual content limited to the active area; and
shift the starting point to a second pixel different than the first pixel according to a pixel shifting technique, the shift of the starting point to uniformly move the active area relative to the plurality of pixels.

26. The electronic device of claim 1, wherein none of the visual content presented by the display is to change scale as the active area moves based on the shift of the starting point.

27. The electronic device of claim 1, wherein each pixel in the first subset of the pixels is to be included in the first subset based on whether a position of the pixel falls within the active area as defined based on the consistent dimensions of the active area relative to the starting point of the active area.

28. An apparatus comprising:
at least one memory;
instructions in the apparatus; and
at least one processor to execute the instructions to:
identify a first pixel of a plurality of pixels of a display as a starting point for an active area of a virtual display, the display including a touch screen interface, the active area corresponding to a first subset of the pixels defined relative to the starting point based on consistent dimensions of the active area, the consistent dimensions matching a fixed pixel width and a fixed pixel height, the virtual display having a margin area corresponding to a second subset of the pixels of the display different than the first subset, the margin area at least partially bordering the active area, particular ones of the plurality of pixels included in the first subset to change as a location of the active area moves relative to the plurality of pixels based on movement of the starting point relative to the plurality of pixels, the active area to maintain the consistent dimensions as the starting point moves;
cause the display to present visual content within the virtual display, the visual content limited to the active area; and
shift the starting point to a second pixel different than the first pixel according to a pixel shifting technique, the shift of the starting point to uniformly move the active area relative to the plurality of pixels.

29. The apparatus of claim 28, wherein the at least one processor is to:
update a touch coordinate offset for the touch screen interface based on the shift of the starting point.

30. The apparatus of claim 29, wherein the at least one processor is to:
obtain touch sensor input to the touch screen interface; and
register the touch sensor input based on the updated touch coordinate offset.

31. The apparatus of claim 29, wherein the at least one processor is to:
obtain touch sensor input to the touch screen interface; and
determine that a portion of the touch sensor input is in the margin area.

32. The apparatus of claim 31, wherein the at least one processor is to:
remove the portion of the touch sensor input that is in the margin area; and
send a remaining portion of the touch sensor input to the touch screen interface.

33. The apparatus of claim 28, wherein the pixel shifting technique defines one or more shifting patterns to be followed by the active area as the starting point shifts.

34. The apparatus of claim 28, wherein the pixel shifting technique includes a pixel aging history analysis.

35. The apparatus of claim 28, wherein the at least one processor is to:
- determine a target resolution for the visual content, the target resolution corresponding to the fixed pixel width and the fixed pixel height; and
- set the margin area and the active area according to the target resolution.

36. The apparatus of claim 35, further including a plurality of touch sensors coupled with the touch screen interface, the at least one processor to:
- configure each of the touch sensors based on the set margin area and the set active area.

37. The apparatus of claim 28, wherein the display is an organic light-emitting diode (OLED) display.

\* \* \* \* \*